(12) United States Patent
Berghorn et al.

(10) Patent No.: US 9,702,933 B1
(45) Date of Patent: Jul. 11, 2017

(54) SYSTEM AND METHOD FOR CONCURRENT INTERCONNECTION DIAGNOSTICS FIELD

(71) Applicant: CADENCE DESIGN SYSTEMS, INC., San Jose, CA (US)

(72) Inventors: Charles R. Berghorn, Staatsburg, NY (US); Barton L. Quayle, San Jose, CA (US); Mitchell G. Poplack, San Jose, CA (US)

(73) Assignee: CADENCE DESIGN SYSTEMS, INC., San Jose, CA (US)

( * ) Notice: Subject to any disclaimer, the term of this patent is extended or adjusted under 35 U.S.C. 154(b) by 10 days.

(21) Appl. No.: 14/920,777

(22) Filed: Oct. 22, 2015

(51) Int. Cl.
*G06F 17/50* (2006.01)
*G01R 31/3177* (2006.01)

(52) U.S. Cl.
CPC ................ *G01R 31/3177* (2013.01)

(58) Field of Classification Search
CPC ..................................................... G06F 17/50
USPC ......................................................... 716/136
See application file for complete search history.

(56) References Cited

U.S. PATENT DOCUMENTS

| | | | |
|---|---|---|---|
| 5,036,473 A | 7/1991 | Butts et al. | |
| 5,109,353 A | 4/1992 | Sample et al. | |
| 5,425,036 A | 6/1995 | Liu et al. | |
| 5,475,830 A | 12/1995 | Chen et al. | |
| 5,551,013 A | 8/1996 | Beausoleil et al. | |
| 5,960,191 A | 9/1999 | Sample et al. | |
| 6,009,256 A | 12/1999 | Tseng et al. | |
| 6,035,117 A | 3/2000 | Beausoleil et al. | |
| 6,051,030 A | 4/2000 | Beausoleil et al. | |
| 6,618,698 B1 | 9/2003 | Beausoleil et al. | |
| 7,739,093 B2 | 6/2010 | Beausoleil et al. | |
| 8,275,588 B2 | 9/2012 | Cha | |
| 9,379,846 B1 | 6/2016 | Poplack et al. | |

(Continued)

OTHER PUBLICATIONS

Mitchell G. Poplack, et al.; U.S. Appl. No. 14/578,173, filed Dec. 19, 2014, entitled "System and Method of Encoding in a Serializer/Deserializer".

(Continued)

*Primary Examiner* — Thuan Do
(74) *Attorney, Agent, or Firm* — Arnold & Porter Kaye Scholar LLP (57) ABSTRACT

Methods and systems for concurrent diagnostics in a functional verification system are disclosed and claimed herein. The methods and systems enable testing the interconnections of a functional verification system while the system implements a hardware design. In one embodiment, a first emulation chip of the functional verification system generates an encoded data word comprising a data word and error correction code (ECC) check bits. The ECC check bits enable a second emulation chip receiving the encoded word to determine whether the data word was received without error. In another embodiment, test patters may be transmitted along the unused interconnections while the functional verification system implements a hardware design in other interconnections. In another embodiment, a dedicated pattern generator generates test patterns to transmit across the interconnection. During clock cycles in which the interconnection is not used to implement the hardware design, a multiplexer transmits the test pattern across the interconnection.

23 Claims, 6 Drawing Sheets

(56) References Cited

U.S. PATENT DOCUMENTS

| | | |
|---|---|---|
| 2006/0029100 A1 | 2/2006 | Dove |
| 2007/0299999 A1 | 12/2007 | Duerk et al. |
| 2008/0109707 A1 | 5/2008 | Dell et al. |
| 2009/0271174 A1* | 10/2009 | Cha ................... G06F 11/261 703/28 |
| 2011/0099407 A1 | 4/2011 | Jonas |
| 2011/0182191 A1 | 7/2011 | Jackson |
| 2011/0264436 A1 | 10/2011 | Ni et al. |
| 2015/0089289 A1 | 3/2015 | Gahoi et al. |

OTHER PUBLICATIONS

Mitchell G. Poplack, et al.; U.S. Appl. No. 14/578,100, filed Dec. 19, 2014, entitled "System and Method of Encoding in a Serializer/Deserializer".
Mike Butts; "Logic Emulation and Prototyping: It's The Interconnect (Rent rules);" RAMP at Stanford; Aug. 2010; 31 pages.
Charles R. Berghorn, et al.; U.S. Appl. No. 14/920,742, filed Oct. 22, 2015, entitled "System and Method for a Consolidated Emulator to Workstation Connection".
Sundar Rajan, et al.; U.S. Appl. No. 14/933,677, filed Nov. 5, 2015 entitled "System for Concurrent Target Diagnostics Field".
Mitchell G. Poplack, et al.; U.S. Appl. No. 15/165,891, filed May 26, 2016 entitled "System and Method of Encoding in a Serializer/Deserializer".

* cited by examiner

SYSTEM AND METHOD FOR CONCURRENT INTERCONNECTION DIAGNOSTICS FIELD

This patent document relates generally to the field of using hardware for verifying the functionality of integrated circuit designs prior to fabrication. In particular, the present patent document relates to systems and methods for concurrent interconnection diagnostics in hardware-based functional verification systems.

CROSS-REFERENCE TO RELATED APPLICATIONS

This patent document is related to U.S. application Ser. No. 14/578,173, entitled "System and Method of Encoding in a Serializer/Deserializer," filed on Dec. 19, 2014, and U.S. application Ser. No. 14/578,100, entitled "System and Method of Encoding in a Serializer/Deserializer, filed on Dec. 19, 2014. U.S. patent application Ser. Nos. 14/578,173 and 14/578,100 are hereby incorporated by reference in their entirety.

BACKGROUND

Hardware-based functional verification systems, including hardware emulation systems and simulation acceleration systems, utilize interconnected programmable logic chips or interconnected processor chips. Examples of systems using programmable logic devices are disclosed in, for example, U.S. Pat. No. 6,009,256 entitled "Simulation/Emulation System and Method," U.S. Pat. No. 5,109,353 entitled "Apparatus for emulation of electronic hardware system," U.S. Pat. No. 5,036,473 entitled "Method of using electronically reconfigurable logic circuits," U.S. Pat. No. 5,475,830 entitled "Structure and method for providing a reconfigurable emulation circuit without hold time violations," and U.S. Pat. No. 5,960,191 entitled "Emulation system with time-multiplexed interconnect." U.S. Pat. Nos. 6,009,256, 5,109,353, 5,036,473, 5,475,830, and 5,960,191 are incorporated herein by reference. Examples of hardware logic emulation systems using processor chips are disclosed in, for example, U.S. Pat. No. 6,618,698 "Clustered processors in an emulation engine," U.S. Pat. No. 5,551,013 entitled "Multiprocessor for hardware emulation," U.S. Pat. No. 6,035,117 entitled "Tightly coupled emulation processors," U.S. Pat. No. 6,051,030 entitled "Emulation module having planar array organization," and U.S. Pat. No. 7,739,093 entitled "Method of visualization in processor based emulation system." U.S. Pat. Nos. 6,618,698, 5,551,013, 6,035,117, 6,051,030, and 7,739,093 are incorporated herein by reference.

Functional verification systems help to shorten the time it takes to design customized application specific integrated circuits (ASICs) by allowing designers to emulate the functionality of the ASIC before a production run has begun. Functional verification systems help to ensure ASICs are designed correctly the first time, before a final product is produced.

Emulators may be either processor-based or field programmable gate array (FPGA) based emulation systems. Processor-based emulation systems comprise one or more emulation boards that include one or more processor-based emulation chips used to implement at least a portion of a hardware design. FPGA-based emulation systems comprise emulation boards comprising FPGA—based emulation chips used to implement at least a portion of a hardware design. The emulation boards are divided into domains that can implement a number of logic gates. For example, each emulation board may comprise eight domains with each domain capable of implementing on the order of a million logic gates. Hardware designs may be allocated amongst the domains of the emulation boards. This allocation allows multiple workstations, each trying to emulate a different hardware design, to utilize the processor-based emulation system simultaneously.

Processor-based emulation system may fail for a variety of reasons. One cause of failure is that there is a problem with interconnections of the processor-based emulation system. Interconnections connect emulation chips of an emulation board, emulation boards to a backplane, and backplanes to system chassis, and chassis to other chassis. These interconnections may comprise copper wires, copper backplanes, optical fibers, or other suitable connections.

When an interconnection failure occurs, the emulation board may need to be replaced. The interconnection failure interferes with the functional verification process because hardware designs cannot be properly implemented in the processor-based emulation system. Further, if a hardware design is being implemented in the processor-based emulation system, an interconnection failure may result in errors or "bugs" being introduced into the implementation process that are attributable to the interconnection failure rather than to a fault in the hardware design.

When replacing an emulation board, interconnections coupled to the emulation board should be tested to ensure the interconnections are working properly. One way of testing the interconnections is to implement test logic, which if implemented correctly, outputs a specific pattern or signal. The test logic is implemented on the domains coupled to the interconnections to be tested. An origin emulation chip transmits signals generated according to the test logic over an interconnection to a destination emulation chip. The destination emulation chip then checks the signals to determine whether the correct signal was received. In this way, the interconnections between the origin and destination emulation chips may be tested. Thus, the interconnection testing process involves at least two tested domains at a time, and may involve domains on the same emulation board or different emulation boards.

Unfortunately, the tested domains cannot run a hardware design and the test logic at the same time. In fact, the tested domains must be taken "offline" and may have to run the test logic for several hours, during which time the domain cannot run hardware designs. This can be especially problematic when an emulation board must be replaced because the domains on the emulation board should be tested to determine whether the interconnections are working properly. This may require taking the entire processor-based emulation system offline since the emulation board may be coupled to all the other emulation boards, requiring all emulation boards to be offline while testing the interconnections.

Some systems allow hardware designs to be allocated to domains that are not currently being tested in order to prevent full processor-based emulation system shutdown. To test interconnections of the replaced emulation board, all emulation boards may eventually need to be tested. After the interconnections between the replaced emulation board and a first emulation board have been tested, the interconnections between the replaced emulation board and a second emulation board may be tested. This testing process should continue until all interconnections of the replaced emulation board have been tested.

While the interconnections are tested, hardware designs may need to be re-located, e.g., executed in different groups of emulation processor chips. In the preceding example, a hardware design running on the second emulation board would be transferred to the first emulation board before testing the interconnections between the replaced emulation board and the second emulation board. This process would continue for all tested emulation boards. In this way, different emulation boards of the processor-based emulation system may be taken offline, while allowing the processor-based emulation system to allocate hardware designs to emulation boards that are online.

This re-location process presents its own problems. First, the re-location process is disruptive. The re-location process requires loading the hardware design onto different emulation chips which takes time, perhaps several hours. To re-locate a design, the state of the hardware design implementation must also be saved and transferred to the new emulation chip in the saved state. Thus, some delay occurs while waiting for the verification process to reach a state that can be saved. Second, the re-location process does not work with domains that are communicating with external targets. The state of the external target cannot be stopped or saved while the domain's hardware design is re-located. Thus, domains communicating with external targets may not be re-located. Third, not all hardware designs may be re-located. A hardware design programmed onto one or more emulation boards will comprise a "hierarchy," or shape. For example, a hardware design may, for example, be implemented on four domains, where the domains on the same emulation board comprise an "L" shape. The hardware design may only be re-located to domains comprising the same hierarchy—in this case an "L" shape—which may not exist when other domains of the processor-based emulation system are in use.

Although currently employed methods and systems for interconnection diagnostics are useful to a degree, there still exists a need for systems that enable concurrent hardware design verification and interconnection diagnostics. Thus, for at least these reasons there is a need for an improved system and method for concurrent interconnection diagnostics.

SUMMARY

Methods and systems for concurrent diagnostics in a functional verification system are disclosed and claimed herein. The methods and systems enable testing the interconnections of a functional verification system while the system implements a hardware design. In one embodiment, a first emulation chip of the functional verification system generates an encoded data word comprising a data word and error correction code (ECC) check bits. The ECC check bits enable a second emulation chip receiving the encoded word to determine whether the data word was received without error. In another embodiment, test patters may be transmitted along the unused interconnections while the functional verification system implements a hardware design in other interconnections. In another embodiment, a dedicated pattern generator generates test patterns to transmit across the interconnection. During clock cycles in which the interconnection is not used to implement the hardware design, a multiplexer transmits the test pattern across the interconnection.

In a first embodiment, a first emulation chip transmits an encoded data word across an interconnection to a second emulation chip. The encoded data word comprises a data word and at least one error correction code (ECC) check bit. The ECC check bit enables the second emulation chip to determine whether the encoded data word was received without error. The data word may be a data word generated during implementation of at least a portion of a hardware design by a functional verification system. Thus, the data word may comprise design data or a marking word. The second emulation chip applies an ECC reversal algorithm to determine whether the encoded data word was received without error. If the received encoded data word comprises an error, the error may be reported. The error may be reported only if the error causes a cumulative error rate greater than a threshold error rate such as one bit in $10^{12}$ bits. This may be done to ensure that the error results from a fault in the interconnection rather than other errors that may occur during operation of the functional verification system.

In another embodiment, at least a portion of a hardware design is compiled on a workstation coupled to a functional verification system. The compiler determines interconnections of a functional verification system that will remain unused during implementation of the hardware design on the functional verification system. The hardware design is uploaded to the functional verification system and test logic is uploaded onto emulation chips that are coupled to unused interconnections. The unused interconnections are set to analog-wrap mode, thereby placing the unused interconnections on a separate clock from the portion of the functional verification system implementing the hardware design. Test logic is also uploaded to a first emulation chip coupled to the unused interconnections.

The test logic generates a test pattern to be transmitted to a second emulation chip coupled to the unused interconnections. The first emulation chip transmits the test pattern across the an interconnection coupling the first emulation chip to the second emulation chip. The second emulation chip transmits the test pattern to the first emulation chip across an interconnection coupling the first emulation chip and the second emulation chip. The first emulation chip determines whether the test pattern was received without error on "loop-back."

In a third embodiment, an emulation chip architecture enables concurrent interconnection diagnostics. A first emulation chip comprises a pattern generator for generating a test pattern to transmit across an interconnection coupling the first emulation chip to a second emulation chip. The pattern generator is coupled to a multiplexer. The multiplexer chooses a signal to transmit across the interconnection. During a clock cycle in which the interconnection is not used to transmit data for implementing at least a portion of a hardware design, the multiplexer chooses to transmit the test pattern across the interconnection. The test pattern enables the second emulation chip to determine whether an error occurred during transmission across the interconnection.

These and other objects, features, aspects, and advantages of the embodiments will become better understood with reference to the following description and accompanying drawings.

BRIEF DESCRIPTION OF THE DRAWINGS

The accompanying drawings, which are included as part of the present specification, illustrate the presently preferred embodiments and together with the general description given above and the detailed description of the preferred embodiments given below serve to explain and teach the principles described herein.

The figures are not necessarily drawn to scale and the elements of similar structures or functions are generally represented by like reference numerals for illustrative purposes throughout the figures. The figures are only intended to facilitate the description of the various embodiments described herein; the figures do not describe every aspect of the teachings disclosed herein and do not limit the scope of the claims.

DETAILED DESCRIPTION

System and methods for concurrent interconnection diagnostics in a processor-based emulation system are disclosed. Each of the features and teachings disclosed herein can be utilized separately or in conjunction with other features and teachings. Representative examples utilizing many of these additional features and teachings, both separately and in combination, are described in further detail with reference to the attached drawings. This detailed description is merely intended to teach a person of skill in the art further details for practicing preferred aspects of the present teachings and is not intended to limit the scope of the claims. Therefore, combinations of features disclosed in the following detailed description may not be necessary to practice the teachings in the broadest sense, and are instead taught merely to describe particularly representative examples of the present teachings.

In the following description, for purposes of explanation only, specific nomenclature is set forth to provide a thorough understanding of the various embodiments described herein. However, it will be apparent to one skilled in the art that these specific details are not required to practice the concepts described herein.

Some portions of the detailed descriptions that follow are presented in terms of algorithms and symbolic representations of operations on data bits within a computer memory. These algorithmic descriptions and representations are the means used by those skilled in the data processing arts to most effectively convey the substance of their work to others skilled in the art. An algorithm may be here, and generally, conceived to be a self-consistent sequence of steps leading to a desired result. The steps may be those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like. It should be borne in mind, however, that all of these and similar terms are to be associated with the appropriate physical quantities and are merely convenient labels applied to these quantities. Unless specifically stated otherwise as apparent from the following discussion, it is appreciated that throughout the description, discussions utilizing terms such as "processing" or "computing" or "calculating" or "determining" or "displaying" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

Also disclosed is an apparatus for performing the operations herein. This apparatus may be specially constructed for the required purposes, or it may comprise a general purpose computer selectively activated or reconfigured by a computer program stored in the computer. Such a computer program may be stored in a computer readable storage medium, such as, but is not limited to, any type of disk, including floppy disks, optical disks, CD-ROMs, and magnetic-optical disks, read-only memories (ROMs), random access memories (RAMs), erasable programmable read-only memories (EPROMs), electrically erasable programmable read-only memories (EEPROMs), magnetic or optical cards, or any type of media suitable for storing electronic instructions, and each coupled to a computer system bus.

Any algorithms that may be presented herein are not inherently related to any particular computer or other apparatus. Various general purpose systems may be used with programs in accordance with the teachings herein, or it may prove convenient to construct a more specialized apparatus to perform the required method steps. The required structure for a variety of these systems will appear from the description below. It will be appreciated that a variety of programming languages may be used to implement the present teachings.

Moreover, the various features of the representative examples and the dependent claims may be combined in ways that are not specifically and explicitly enumerated in order to provide additional useful embodiments of the present teachings. It is also expressly noted that all value ranges or indications of groups of entities disclose every possible intermediate value or intermediate entity for the purpose of original disclosure, as well as for the purpose of restricting the claimed subject matter. It is also expressly noted that the dimensions and the shapes of the components shown in the figures are designed to help to understand how the present teachings are practiced, but not intended to limit the dimensions and the shapes shown in the examples.

Figure 1:
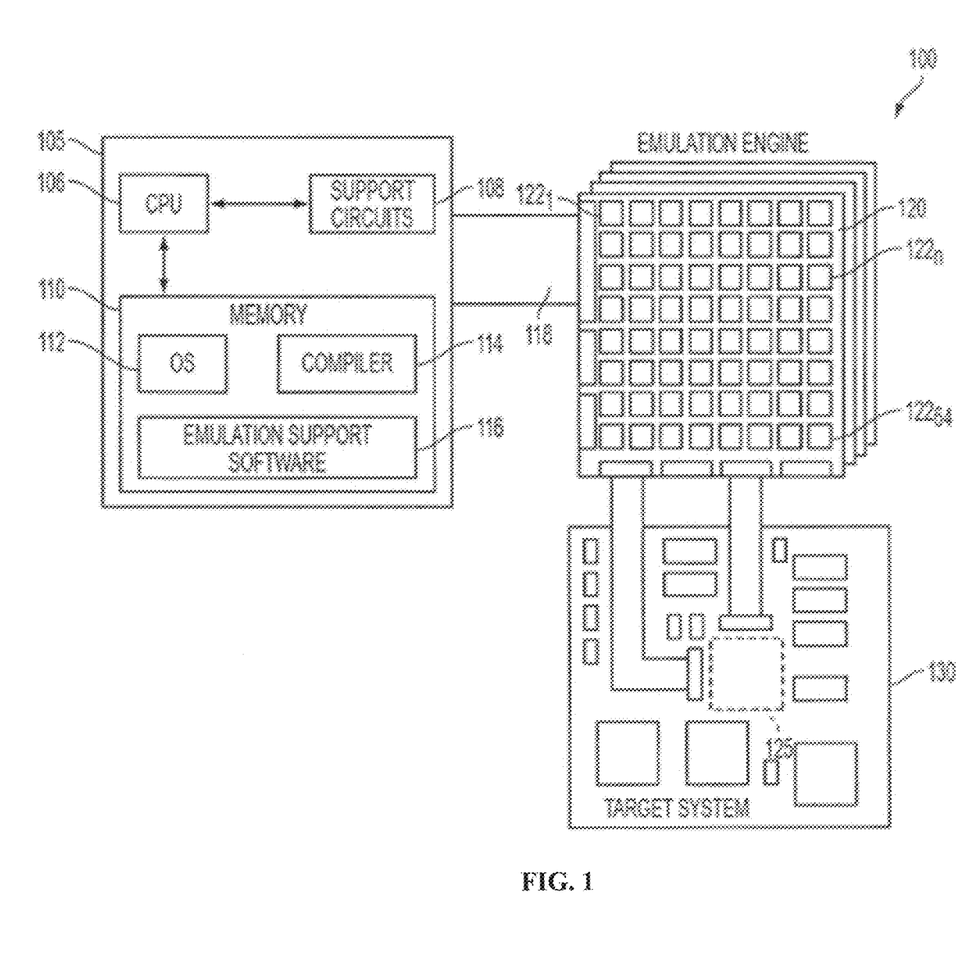
FIG. 1 illustrates an overview of one embodiment of a processor-based emulation system 100.

FIG. 1 illustrates an overview of an embodiment of a processor-based emulation system 100. The system comprises a host or computer workstation 105, an emulation system including at least one emulation board 120, and optional target system 130. While a processor-based emulation engine is described, though other emulation engines, such as those utilizing arrays of programmable logic devices (such as FPGAs) may also be used, for example properly-configured versions of the systems discussed above.

The host workstation 105 provides emulation support facilities to the emulation system 100 and emulation board 120. The host workstation 105, for example a personal computer, may comprise at least one central processing unit (CPU) 106, support circuits 108, and a memory 110. The CPU 106 may comprise one or more conventionally available microprocessors and/or microcontrollers. The support circuits 108 may be well known circuits that are used to support the operation of the CPU 106. These supporting circuits may comprise power supplies, clocks, input/output interface circuitry, cache, and other similar circuits.

Memory 110, sometimes referred to as main memory, may comprise random access memory, read only memory, disk memory, flash memory, optical storage, and/or various combinations of these types of memory. Memory 110 may in part be used as cache memory or buffer memory. Memory 110 may store various forms of software and files for the emulation system, such as an operating system (OS) 112, a compiler 114, and emulation support software 116.

The compiler 114 converts a hardware design, such as hardware described in VHDL or Verilog programming language, to a sequence of instructions that can be evaluated by the emulation board 120.

The host workstation 105 allows a user to interface with the emulation system 100 via communications channel 118, including emulation board 120, and control the emulation process and collect emulation results for analysis. Under control of the host workstation 105, programming information and data is loaded to the emulation system 100. In other embodiments, the functionality of host workstation may be part of the emulation system 100 itself. For example, emulation system 100 may also include microprocessor, for example, an x86 microprocessor and data storage such as hard disk drives (HDDs). In this way, the x86 microprocessor and HDDs may be used similar to a host workstation to load designs onto the emulation system 100. This is particularly advantageous in the case of diagnostics and small designs that can be loaded onto emulation system 100 without involvement of external workstations.

The emulation board 120 has on it a number of individual emulation chips, for example the 64 emulation chips $122_1$ to $122_{64}$ (collectively 122) shown in FIG. 1, in addition to miscellaneous support circuitry. There may be any number of emulation chips. The emulation chips 122 are designed to mimic the functionality of any synchronous ASIC design using programmable logic. This is done in order for chip designers to prototype their ASIC design using processor based emulation before having actual silicon in hand. Communication between emulation chips 122 is established via serial input/output (I/O) links. There may be numerous output lanes per emulation chip 122. Some of the I/O links may remain on the card on copper. For longer connections to other cards, the signals may be relayed through optical transceivers and cables.

In response to programming received from the emulation support software 116, emulation system 100 emulates at least a portion 125 of the target system 130. Portion 125 of the target system 130 may be an integrated circuit design, a memory design, a processor design, or any other object or device that may be expressed as a hardware description language. Exemplary hardware description languages include Verilog and VHDL.

Figure 2:
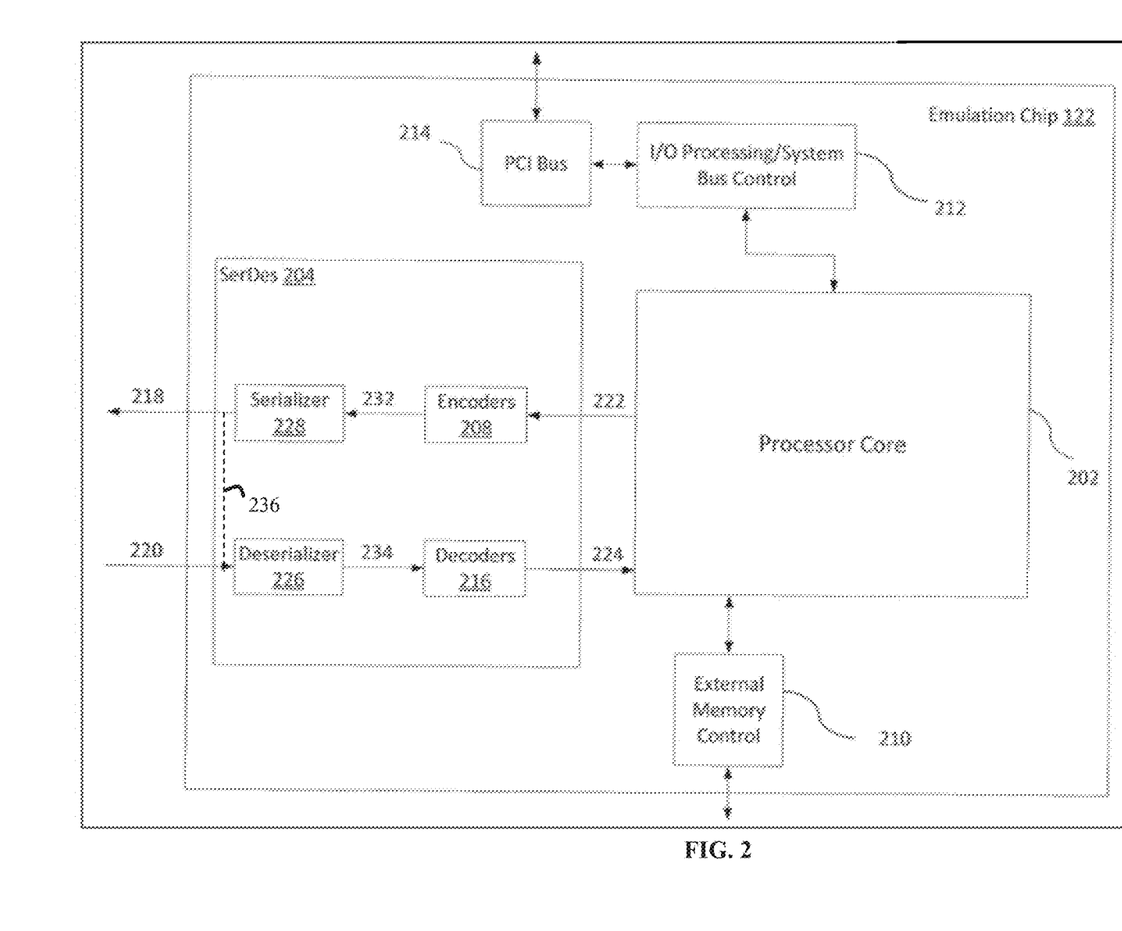
FIG. 2 illustrates a block diagram of one embodiment of an emulation chip of a hardware functional verification system.

FIG. 2 illustrates a block diagram of one embodiment of an emulation chip of a hardware functional verification system. The device of FIG. 2 is an embodiment of one of the emulation chips $122_1$ to $122_{64}$ (collectively 122) shown in FIG. 1. An emulation chip 122 has a processor core 202 where instructions are carried out, such as instructions for emulation of a circuit design implemented with execution of Boolean equations. The processor core includes emulation processors arranged in a hierarchy of processor clusters, embedded memory, interconnect, and communications and other emulation support circuitry. The I/O processing/system bus control 212 controls the peripheral component interconnect (PCI) bus 214. The PCI bus may also be a general I/O bus. In other embodiments, the PCI bus may be a PCI bus with higher speed than a standard PCI bus (e.g. PCIe). During the emulation process, the processor core 202 may send processed data to or receive processed data from the SerDes 204. SerDes 204 may include components that may be considered part of a physical coding sublayer (or PCS) logic. The SerDes 204 contains encoders 208. The encoders 208 encode the data according to a selected mode. The encoded data is then serialized prior to transmission on output link 218 to other emulation chips 122 of the system, or other destinations. The SerDes 204 also deserializes incoming data from other emulator chips 122 on input link 220, and decodes the data with decoders 216. The emulator chips 122 may also contain an external memory control 210 in communication with the processor 202. The parallel data interfaces of the SerDes are typically synchronous to the main on-chip clock. Typically, the SerDes 204, encoders 208, and decoders 216 may be implemented with hardware. In other embodiments, the SerDes 204, encoders 208, and decoders 216 may also be implemented with software.

FIG. 2 illustrates a single SerDes 204. However, the SerDes 204 in physical implementation may comprise multiple individual serializer/deserializer blocks that may perform the encoding and decoding described in the present disclosure in parallel for a number of different interconnections. For example, it is contemplated that a typical hardware functional verification system may have many thousands or even millions of such interconnections. Encoding and the corresponding decoding (on a different emulation chip) may also be customized to a particular serializer/deserializer block, such that the encoding and decoding modes used for a particular interconnection may be different, even between the same set of emulation chips.

U.S. application Ser. Nos. 14/578,173 and 14/578,100 disclose methods and systems of encoding in a serializer/deserializer of a functional verification system, those applications are hereby incorporated by reference as if fully set forth herein. U.S. application Ser. No. 14/578,173 discloses an embodiment wherein the encoders 208 of the SerDes 204 encode data words to be transmitted on output link 218 in a default mode having a number of different encoding stages. The encoders 208 can encode data words for transmission according to a number of encoding modes, including a default mode. The default encoding mode (13B/20B) includes at least the following encoding stages prior to transmission: invert bit insertion, scrambling, error correction code (ECC) check bit insertion, DC balancing, and shuffling. Thus, a transmitting emulation chip may transmit an encoded data word comprising the data word and ECC check bits.

One of ordinary skill in the art will recognize that based upon the teachings of the present disclosure, a number of alternate modes of encoding and decoding are possible. The default encoding mode is discussed to provide certain principles of the present teachings and is intended for illustration purposes.

Figure 3:
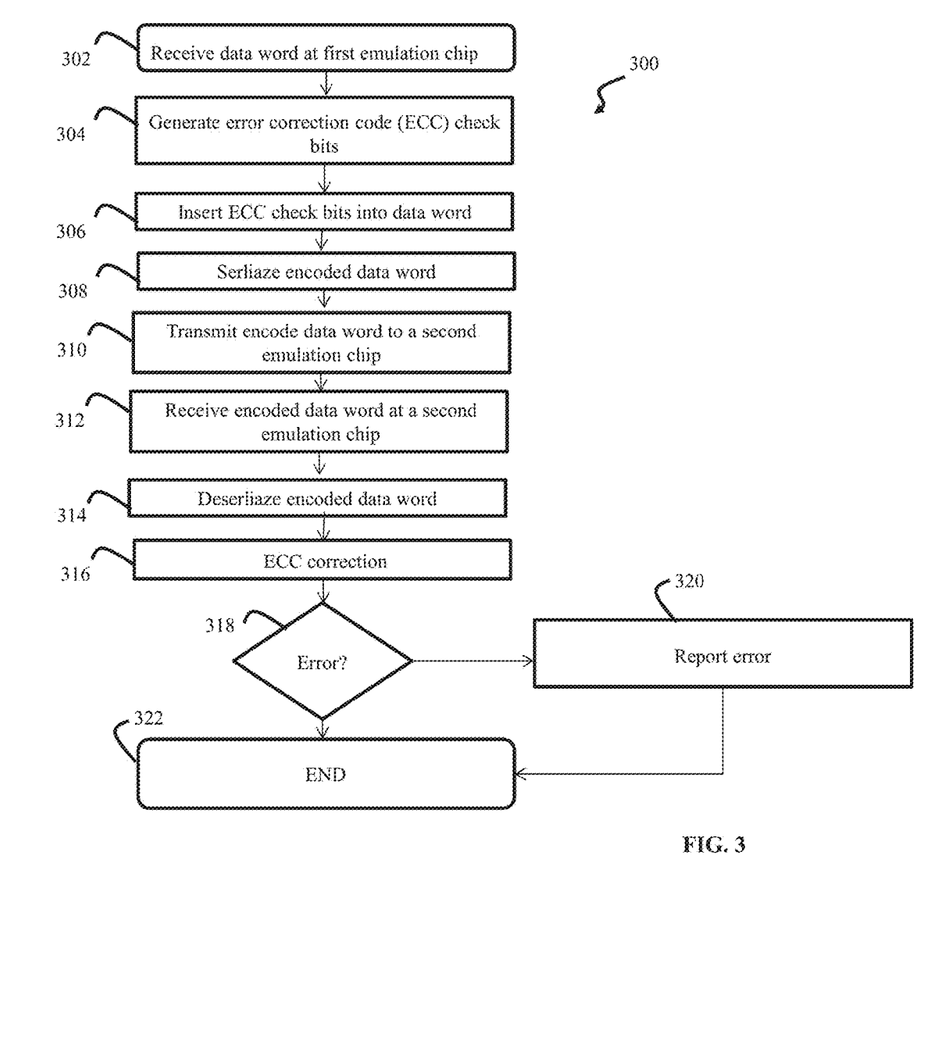
FIG. 3 illustrates exemplary method 300 enabling concurrent interconnection diagnostic utilizing error correction code (ECC) check bits.

FIG. 3 illustrates exemplary method 300 enabling concurrent interconnection diagnostic utilizing ECC check bits. Method 300 uses ECC check bits that are generated and checked during transmission of data across interconnections of a functional verification system to diagnose interconnection failures between emulation chips. In this way, interconnections of a functional verification system may be tested for failure while the functional verification system implements at least a portion of a hardware design.

At step 302, a data word is received at a first emulation chip. For example, the data word may be received at an encoder of a serializer/deserializer of a first emulation chip from the processor core of the emulation chip. The data word may carry design data used to implement a hardware design in a functional verification system. Additionally, the data word may instead carry a "marking" word that is used to ensure the words are properly aligned during serializer/deserializer communications. Thus, the data word comprises data that is used while the functional verification system executes a user's logic design. In this way, method 300 enables concurrent diagnostic of interconnections of a functional verification system while the functional verification system implements at least a portion of a hardware design without the need to take emulation boards, emulation chips, or domains offline while testing interconnections.

At step 304, at least one ECC check bit is generated. The ECC check bits enable the receiving emulation chip to determine whether the data word contains an error. The ECC check bits may also enable the receiving emulation chip to correct the error in the data word. For example, in a 20-bit encoded data word, six ECC check bits are generated which enables the receiving emulation chip to correct a 1-bit error in a 12-bit data word that also comprises one invert bit.

At step 306, the ECC check bits are inserted into the data word. At step 308, the encoded data word is serialized for transmission to the second emulation chip. At step 310, the encoded data word is transmitted to a second emulation chip. The encoded data word travels along the interconnection coupling the first emulation chip and the second emulation chip. The first emulation chip and the second emulation chip may be in the same domain, in the same emulation board, in different emulation boards, or even in different clusters or racks. Thus, flow 300 enables testing interconnections coupling two emulation chips.

At step 312 the encoded data word comprising the data word and at least one ECC check bit is received at a second emulation chip. For example, the encoded data word may be received at the serializer/deserializer of the second emulation chip. At step 314, the encoded data word is deserialized.

At step 316, an ECC reversal algorithm is applied to the encoded data word at the second emulation chip. The ECC reversal algorithm checks the ECC check bits and data to determine whether an error occurred during transmission of the encoded data word. The algorithm may also correct the error.

At step 318, the presence of an error in encoded data word is determined. If an error has been detected, method 300 proceeds to step 320. If no error has been detected, method 300 proceeds to end step 322. Method 300 may be repeated to determine errors resulting from further communications across the interconnection.

At step 320, the error is reported. The error may be reported in a variety of ways. For example, software on a workstation may periodically poll the functional verification system to determine the presence of an error. Functional workstation hardware may also push the error to the workstation. The error report may comprise information identifying the specific interconnection over which encoded data word was transmitted and/or the specific domain, emulation chip, emulation board, or cluster or rack in which the error was detected.

The error report may not identify whether a fault exists with the interconnection. The error may result from other processes that may cause errors during transmission of data across emulation chips. Method 300 will continue to run on other data words transmitted across the interconnection. When a sufficient number of errors occur, for example 1 error in every $10^{12}$ bits, the error likely stems from a fault with the interconnection.

Figure 4:
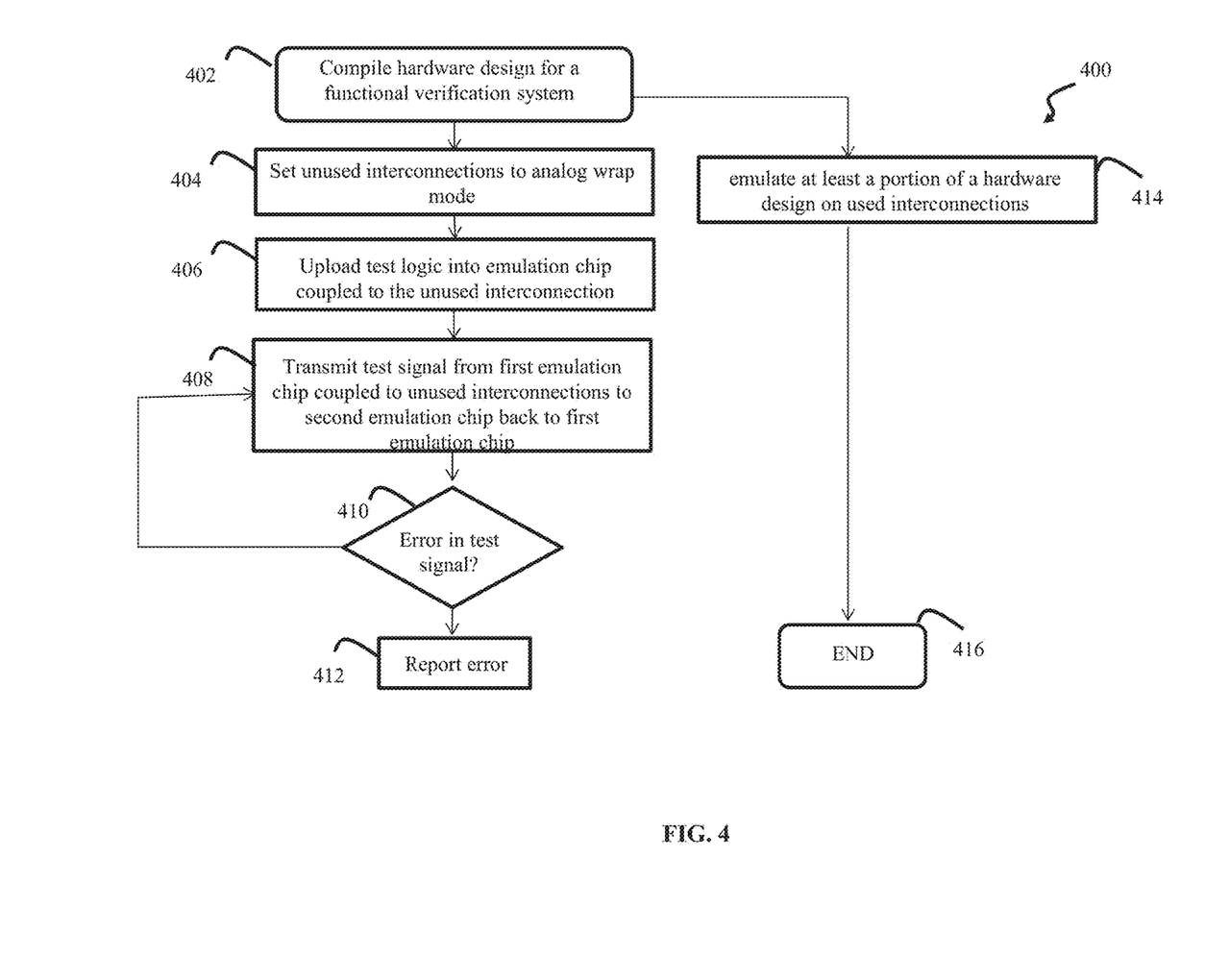
FIG. 4 illustrates exemplary method 400 for concurrent interconnection diagnostics by testing unused interconnections while hardware design implementations continue in a functional verification system.

FIG. 4 illustrates exemplary method 400 for concurrent interconnection diagnostics by testing unused interconnections while emulation of a user's logic design continues in the functional verification system 100. This is possible because certain interconnections between emulation chips may remain unused while other interconnections are used to emulate a user's logic design. In this situation, flow 400 enables testing of interconnections that remain unused when functional verification system implements a portion of a hardware design.

At step 402, at least a portion of a portion of a user's hardware logic design is compiled on a workstation 105 coupled to a functional verification system 100. The compiler 114 determines the interconnections that will remain unused while the hardware design is implemented on the functional verification system. After a user's design is compiled, the functional verification system can be programmed to emulate the user's design, which takes place as step 414 in FIG. 4. Note that the step of emulating the user's design 414 can take place at the same time as steps 404-412 (to be discussed) are also taking place. Thus, as will be seen, diagnostic testing of interconnect can be performed concurrently with emulation of at least a portion of a user's design.

At step 404, the unused interconnections are set to what is referred to herein as analog wrap-mode. In analog wrap mode, the unused interconnections are de-coupled from the clock of functional verification system. This is so that when test patterns are sent across the unused interconnections, while the used interconnections continue to operate concurrently according the clock controlling implementation of the user's hardware logic design, the clock controlling the user's hardware logic design. As shown in FIG. 2, a test pattern may be sent across interconnection 220 of a first emulation chip, received at the second emulation chip and transferred across connection 236 and wrapped back to the first emulation chip across interconnection 218.

At step 406, the test logic is uploaded to a first emulation chip coupled to unused interconnections and then is executed on the processors in the emulation chip. A processor-based emulation system that communicates using serializer/deserializer as shown in FIG. 2 will have an even number of unused connections because the communications are sent on output link 218 of a first emulation chip and will be received on input link 220 of the first emulation chip. Thus, there will be an even number of unused interconnections because the test pattern must be serialized and sent across the output link of the first emulation chip and then received at the input link of the first emulation chip and deserialized.

At step 408, the first emulation chip transmits one or more test signals across an interconnection to a second emulation chip. The test logic uploaded to the first emulation chip generates the test signals. The second emulation chip receives the test signal and transmits the test signal back to the first emulation chip.

At step 410, the first emulation chip determines whether the test signal was received properly or whether there was an error during loop-back. The first emulation chip uses test logic uploaded at step 406 to determine whether the test signal was transmitted without error. If the test signal comprises an error, the error may be reported at step 412. The methods applied in error report step 316 of FIG. 3 may also be used to report the error at step 412. If no error occurred, flow 400 returns to step 408 and the unused connections may be repeatedly tested while implementing a hardware design on the functional verification system.

At step 412, which occurs substantially concurrently with steps 404 through 408, used interconnections of the functional verification system and perhaps even the same emulation chip emulate at least a portion of a hardware design. The functional verification system continues emulating the hardware design on used interconnections until END step 416.

Method 400 is advantageous for several reasons. First, emulation chips need not contain specialized hardware for testing the interconnections. The test logic may be uploaded and programmed into the emulation processors on the chip while emulating the user's hardware logic design. Second, while interconnections between emulation chips, interconnections between boards, and interconnections between chassis rarely fail, the system must still allow for testing all of them regardless of whether such interconnections have a low probability of failure. In prior systems, hardware and software used for testing interconnections used significant resources that could only be used for test. For example, upload of test logic caused both chips coupled by interconnections to be taken offline and inoperable to emulate a hardware design while testing the interconnection. That is because the test logic—such as test pattern generation and checking logic—needed to be uploaded to both chips coupled by an interconnection. Thus, the emulation chips were used to test the interconnection rather than to emulate a portion of a hardware design. Method 400 enables testing interconnections and minimal cost since flow 400 test unused interconnections and may test two connections at once. This is because test generation and checking logic need only be uploaded to one emulation chip because the analog wrap mood loops back the test signal. Third, method 400 does not interfere with interconnections that are used to run at least a portion of a hardware design. Thus, there is less risk of corrupting design data or marking words used in the emulation process.

Figure 5:
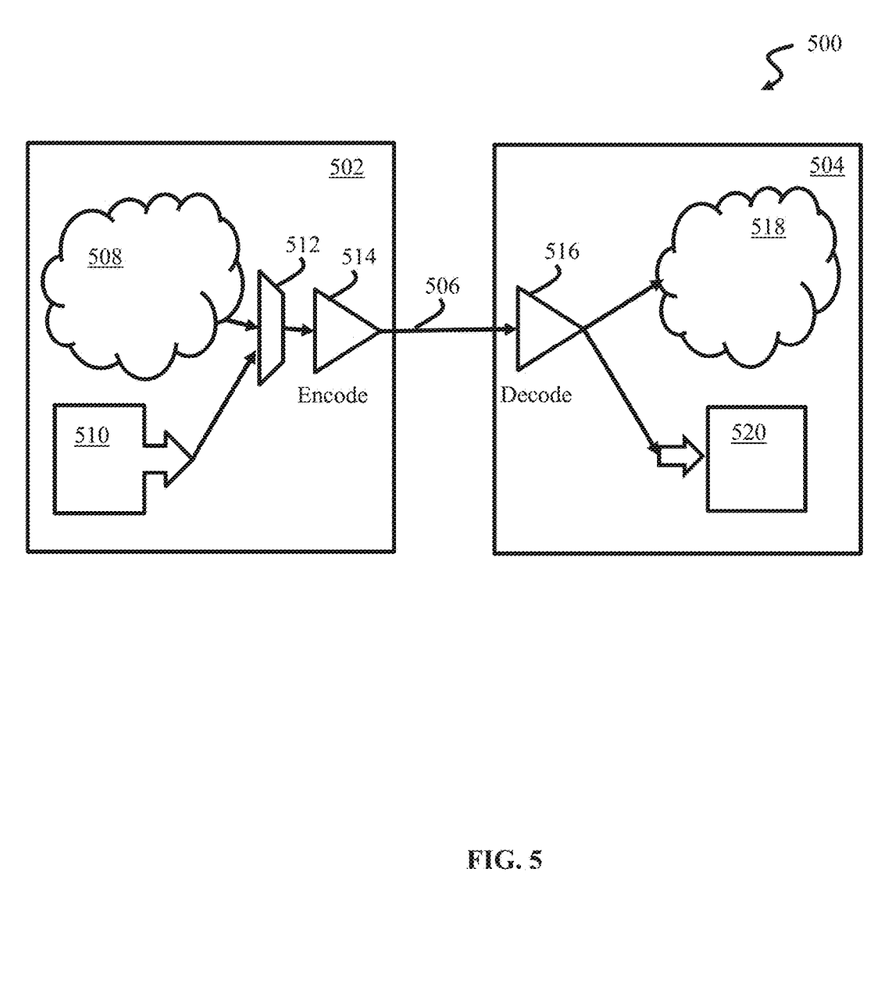
FIG. 5. illustrates exemplary architecture 500 enabling concurrent interconnection diagnostics comprising transmitting emulation chip 502 and receiving emulation chip 504 coupled by interconnection 506.

FIG. 5. illustrates exemplary architecture 500 comprising transmitting emulation chip 502 and receiving emulation chip 504 coupled by interconnection 506. Architecture 500 provides another embodiment for concurrent interconnection diagnostics. Architecture 500 may also be used when implementing the flows of FIGS. 3 and 4.

Emulation chips 502 and 504 may be in the same domain, on the same emulation board, or on different emulation boards. Further, emulation chips 502 and 504 will typically be coupled via multiple interconnections. Emulation chips 502 and 504 will also typically be substantially identical, however only the logic for testing one interconnection is shown.

Emulation chip 502 comprises emulation processors executing a portion of a user's hardware logic design logic 508. Emulation chip 502 also includes pattern generator 510, multiplexer (mux) 512, and encoder 514. User's hardware logic design logic 508 implements a portion of a hardware design and may generate design data that is transmitted across interconnection 506. User's hardware logic design logic 508 does not generate design data every clock cycle when functional verification system implements a hardware design. Thus, interconnection 506 may not carry design data during a clock cycle where logic 508 does not generate design data. Design logic is coupled to mux 512.

Pattern generator 510 generates test signals to test interconnection 506 for faults. For example, test signals may comprise a pseudo-random binary sequence (PRBS) or other bit error rate test (BERT) patterns. Pattern generator 510 is coupled to mux 512. Pattern generator can be programmed into emulation chip 502 using emulation processors. Likewise, in another embodiment, pattern generator can be fabricated into the emulation chip 502.

Mux 512 selects a signal for transmission across interconnection 506. Mux 512 can select between signals generated by a user's hardware logic design logic 508 and signals generated by pattern generator 510. On clock cycles where a user's hardware design logic 508 does not generate signals for transmission across interconnection 506, Mux 512 chooses test signals generated from pattern generator 510. Workstation software may provide signaling to Mux 512 that enables selection between design logic 508 and pattern generator 510. For example, workstation software may set Mux 512 register As seen in FIG. 5, inputs to Mux 512 are coupled to user hardware logic design 508, and pattern generator 510, while output of Mux 512 is coupled encoder 514. Encoder 514 is part of a SerDes. As previously explained, encoder 514 encodes data for serial transmission across interconnection 512.

Interconnection 506 couples emulation chip 502 and emulation chip 504. Interconnection 506 may comprise a copper wire, copper backplane, optical fiber, or other suitable connection. Interconnection 506 may couple emulation chips 502 and 504 that are in the same domain, on different emulation boards, or even different clusters or racks. Although not shown in FIG. 5, emulation boards 502 and 504 may be coupled via a plurality of interconnections.

Emulation chip 504 comprises decoder 516, design logic 518, and pattern checker 520. Emulation chip 504 may also comprise components of emulation chip 502, and vice-versa. For example, if interconnection allowing communication from emulation chip 504 to emulation chip 502 were shown in FIG. 5, components of emulation chip 502 would be shown in emulation chip 504.

Decoder 516 can receive signals generated by the user's hardware logic design 508 or test signals generated by pattern generator 510, both of which can be transmitted over interconnect 506. Decoder 516 transmits the received communication to design logic 518 and pattern checker 520. Pattern checker 520 determines whether an error occurred during transmission of the test signal from emulation chip 502 to emulation chip 504 via interconnection 506.

If an error occurred, the error may be reported. Thus, emulation chip 502 enables running a hardware design in certain cycles while testing the same interconnection in other cycles.

Figure 6:
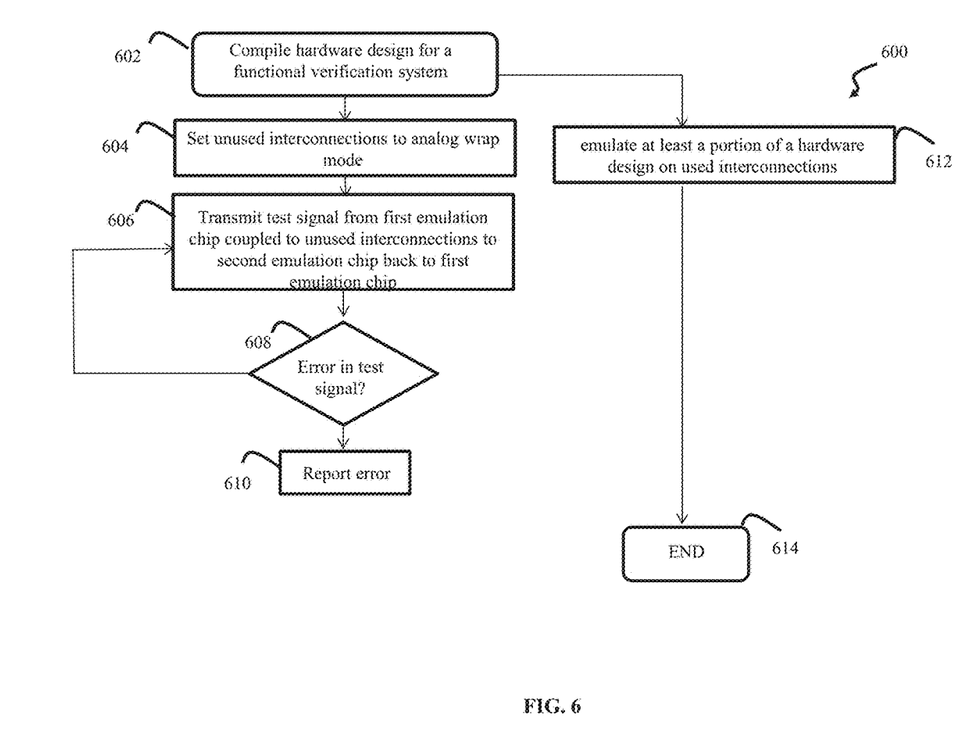
FIG. 6 illustrates exemplary method 600 for concurrent interconnection diagnostics by testing unused interconnections using pattern generator 510 and pattern checker 520 of the same emulation chip.

In another embodiment, the pattern generator 510 and pattern checker of an emulation chip 502 of FIG. 5 may be used in combination with analog wrap mode described in connection with FIG. 4. FIG. 6 illustrates exemplary method 600 for concurrent interconnection diagnostics by testing unused interconnections using pattern generator 510 and pattern checker 520 of the same emulation chip.

At step 602, at least a portion of a portion of a user's hardware logic design is compiled on a workstation 105 coupled to a functional verification system 100. The compiler 114 determines the interconnections that will remain unused while the hardware design is implemented on the functional verification system. After a user's design is compiled, the functional verification system can be programmed to emulate the user's design, which takes place as step 612 in FIG. 6. Note that the step of emulating the user's design 612 can take place at the same time as steps 604-610 (to be discussed) are also taking place. Thus, as will be seen, diagnostic testing of interconnect can be performed concurrently with emulation of at least a portion of a user's design.

At step 604, the unused interconnections are set to what is referred to herein as analog wrap-mode. In analog wrap mode, the unused interconnections are de-coupled from the clock of functional verification system. This is so that when test patterns are sent across the unused interconnections, while the used interconnections continue to operate concurrently according the clock controlling implementation of the user's hardware logic design, the clock controlling the user's hardware logic design. As shown in FIG. 2, a test pattern may be sent across interconnection 220 of a first emulation chip, received at the second emulation chip and transferred across connection 236 and wrapped back to the first emulation chip across interconnection 218.

At step 606, the first emulation chip transmits one or more test signals across an interconnection to a second emulation chip. The pattern generator 510 of a first emulation chip generates a test signal comprising a test pattern to test the interconnections between a first emulation chip and a second emulation chip. As explained, the test pattern may be wrapped back to the first emulation chip, where the pattern checker of the first emulation chip will check whether the test signal was received properly. In this way, the pattern checker and pattern generator are resources of an emulation chip that may be used to test interconnections without requiring separate test logic to be uploaded to an emulation chip.

At step 608, the first emulation chip determines whether the test signal was received properly or whether there was an error during loop-back. The first emulation chip uses pattern checker to determine whether the test signal was transmitted without error. If the test signal comprises an error, the error may be reported at step 610. The methods applied in error report step 316 of FIG. 3 may also be used to report the error at step 610. If no error occurred, flow 600 returns to step 606 and the unused connections may be repeatedly tested while implementing a hardware design on the functional verification system.

At step 412, which occurs substantially concurrently with steps 604 through 610, used interconnections of the functional verification system and perhaps even the same emulation chip emulate at least a portion of a hardware design. The functional verification system continues emulating the hardware design on used interconnections until END step 614.

Although the embodiments have been described with reference to the drawings and specific examples, it will readily be appreciated by those skilled in the art that many modifications and adaptations of the apparatuses and processes described herein are possible without departure from the spirit and scope of the embodiments as claimed hereinafter. Thus, it is to be clearly understood that this description is made only by way of example and not as a limitation on the scope of the claims.

It will be understood that when an element is referred to as being "coupled" to another element, it can be directly connected or coupled to the other element or intervening elements may be present. In contrast, when an element is referred to being "directly connected" or "directly coupled" to another element, there are no intervening elements.

We claim:

1. A method for concurrent interconnection diagnostics in a hardware-based emulation system, comprising:
   (a) generating a test pattern on a pattern generator of a first emulation chip of the hardware-based emulation system, the test pattern capable of use in testing an interconnection between the first emulation chip and a second emulation chip of the hardware-based emulation system;
   (b) selecting the test pattern for transmission across the interconnection, wherein the test pattern is selected when the interconnection is not used for emulating at least a portion of a hardware design;
   (c) encoding the test pattern on a serializer/deserializer of the first emulation chip, the serializer/deserializer serializing data of the test pattern;
   (d) transmitting the test pattern that has been serialized across the interconnection not used for emulating at least a portion of the hardware design;
   (e) receiving the test pattern that has been serialized on a serializer/deserializer of the second emulation chip;
   deserializing the test pattern that has been serialized by the serializer/deserializer of the first emulation chip;
   (g) checking the test pattern to determine whether the second emulation chip received the test pattern without error thereby determining whether that has been an interconnection failure;
   (h) implementing at least a portion of a hardware design on either the first emulation chip or the second emulation chip while performing steps (a)-(g).

2. The method of claim 1, wherein the first emulation chip and the second emulation chip are on a same emulation board.

3. The method of claim 1, wherein the first emulation chip and the second emulation chip are on different emulation boards.

4. The method of claim 1, wherein the step of implementing a hardware design further comprises the step of emulating a hardware design.

5. The method of claim 1, wherein the step of implementing a hardware design further comprises the step of executing a hardware design for simulation acceleration.

6. A method for concurrent interconnection diagnostics in a hardware-based emulation system, comprising:
   (a) encoding a data word in a serializer/deserialzer of a first emulation chip, wherein encoding the data word generates an encoded data word, wherein the encoded data word comprises the data word and at least one check-bit of an error correction code (ECC);
   (b) serializing the encoded data word into a serialized data stream;
   (c) transmitting the encoded data word that has been serialized across an interconnection, wherein the interconnection couples the first emulation chip to a second emulation chip;
   (d) receiving the encoded data word that has been serialized at a serializer/deserializer of the second emulation chip;
   (e) deserializing the encoded data word;
   (f) applying an ECC reversal algorithm to the encoded data word, wherein the ECC reversal algorithm determines whether the encoded data word comprises an error, thereby determining whether that has been an interconnection failure;
   (g) reporting an indication of the error.

7. The method of claim 6, wherein the step of transmitting the encoded data word that has been serialized across an interconnection further comprises the step of transmitting the encoded data word across the first emulation chip on a same emulation board as the second emulation chip.

8. The method of claim 6, wherein the step of transmitting the encoded data word that has been serialized across an interconnection further comprises the step of transmitting the encoded data word across the first emulation chip on a different emulation board than the second emulation chip.

9. The method of claim 6, wherein the step of reporting an indication of the error further comprises the step of reporting an indication of the error only if the error results in an error rate greater than a threshold error rate.

10. The method of claim 9, wherein the threshold error rate is one bit error in on the order of $10^{12}$ bits.

11. The method of claim 6, wherein the encoded data word comprises design data.

12. The method of claim 6, wherein the encoded data word comprises a marking word.

13. The method of claim 6, wherein the encoded data word consists of 12-bit word for design data, one invert bit, and six ECC check-bits.

14. A method for concurrent interconnection diagnostics in a hardware-based emulation system, comprising:
 (a) using a computer workstation supporting the hardware-based emulation system, compiling at least a portion of a hardware logic design into a compiled logic design, the compiled logic design to be programmed into a plurality of emulation chips of the hardware-based emulation system;
 (b) determining which of a plurality of interconnections between the plurality of emulation chips will be unused interconnections while emulating the at least a portion of a hardware design;
 (c) uploading the at least a portion of a hardware design onto the hardware-based emulation system;
 (d) uploading test logic to test at least two of the unused interconnections, wherein the test logic generates a test pattern capable of use in testing the at least two unused interconnections;
 (e) serializing the test pattern in a serializer/deserializer of a first emulation chip into a serialized data stream;
 (f) transmitting the test pattern that has been serialized across a first interconnection from the at least two unused interconnections, wherein the at least two unused interconnections couples the first emulation chip to a second emulation chip;
 (g) transmitting the test pattern that has been serialized across a second interconnection from the at least two unused interconnections;
 (h) receiving the test pattern that has been serialized in the first emulation chip;
 (i) deserializing the test pattern in a serializer/deserializer of the first emulation chip;
 (j) checking the test pattern to determine whether the second emulation chip received the test pattern without error, thereby determining whether that has been an interconnection failure; and
 (k) implementing the at least a portion of a hardware design in the hardware-based emulation system while implementing the test logic to test the at least one unused interconnection.

15. The method of claim 14, further comprising the step of reporting an error determined by implementing the test logic.

16. The method of claim 14, further comprising the step of implementing the test logic according to a first clock and implementing the at least a portion of a hardware logic design according to a second clock.

17. A method for concurrent interconnection diagnostics in a hardware-based emulation system, the hardware-based emulation system comprising a plurality of emulation chips, comprising:
 (a) using a computer workstation supporting the hardware-based emulation system, compiling at least a portion of a hardware logic design into a compiled logic design, the compiled logic design to be programmed into a plurality of emulation chips of the hardware-based emulation system;
 (b) using a compiler in the computer workstation, determining which of a plurality of interconnections between the plurality of emulation chips of the hardware-based emulation system will be unused interconnections while the hardware-based emulation system emulates the at least a portion of a hardware design;
 (c) uploading the at least a portion of a hardware design onto the hardware-based emulation system;
 (d) generating a test signal in a pattern generator of a first emulation chip to test at least two of the unused interconnections, wherein the test signal is capable of use in testing the at least two unused interconnection;
 (e) serializing the test signal in a serializer/deserializer of the first emulation chip into a serialized data stream;
 (f) transmitting the test signal that has been serialized across a first unused interconnection selected from the at least two unused interconnections, wherein the first unused interconnection couples the first emulation chip to a second emulation chip;
 (g) receiving the test signal that has been serialized in the second emulation chip;
 (h) transmitting the test signal that has been serialized back from the second emulation chip to the first emulation chip across a second unused interconnection selected from the at least two unused interconnections, wherein the second unused interconnection couples the first emulation chip to the second emulation chip;
 (i) deserializing the test signal in a serializer/deserializer of the first emulation chip;
 (j) checking the test signal in a pattern checker of the first emulation chip, the pattern checker capable of determining whether the test signal was received without error, thereby determining whether that has been an interconnection failure;
 (k) implementing the at least a portion of a hardware logic design in the hardware-based emulation system while implementing the test signal to test the at least two unused interconnection.

18. The method of claim 17, further comprising the step of reporting an error determined by implementing the test logic.

19. The method of claim 17, further comprising the step of implementing the test signal according to a first clock and implementing the at least a portion of a hardware logic design according to a second clock.

20. A hardware-based emulation system, comprising:
 a first emulation chip, comprising:
  a pattern generator capable of generating a test pattern, the test pattern capable of use in determining whether an error occurred during transmission of the test pattern;
  a multiplexer to determine signals to transmit across an interconnection, the multiplexer operable to transmit the test pattern across the interconnection during a clock cycle in which the interconnection will not be used to transmit design data generated during implementation of at least a portion of a hardware design;
  a first serializer/deserializer coupled to an output of the multiplexer that serializes the test pattern into a serial data stream for transmission over the interconnection;

a second emulation chip coupled to the first emulation chip by the interconnection, the second emulation chip comprising:
- a second serializer/deserializer coupled to the interconnection, the second serializer/deserializer deserializeing the serial data stream into a deserialized data stream;
- a pattern checker coupled to the second serializer/deserializer to receive the deserialized data stream, the pattern checker operable to determine whether an error occurred during transmission of the test pattern, thereby determining whether that has been an interconnection failure.

21. The emulator of claim 20, wherein the pattern generator generates a test pattern comprising a pseudo-random binary sequence.

22. The emulator of claim 20, wherein the first emulation chip and the second emulation are on a same emulation board.

23. The emulator of claim 20, wherein the first emulation chip and the second emulation are on different emulation boards.

* * * * *